United States Patent [19]

Harada et al.

[11] Patent Number: 4,866,373

[45] Date of Patent: Sep. 12, 1989

[54] SUPERCONDUCTING CURRENT DETECTING CIRCUIT EMPLOYING DC FLUX PARAMETRON CIRCUIT

[75] Inventors: Yutaka Harada, Tokyo; Eiichi Goto, Fujisawa; Ushio Kawabe, Tokyo; Nobuo Miyamoto; Hideaki Nakane, both of Hachioji; Mutsuko Hatano, Kodaira, all of Japan

[73] Assignees: Hitachi, Ltd., Tokyo; Rikagaku Kenkyusko, Wako, both of Japan

[21] Appl. No.: 291,338

[22] Filed: Dec. 28, 1988

Related U.S. Application Data

[63] Continuation of Ser. No. 869,984, Jun. 3, 1986, abandoned.

[30] Foreign Application Priority Data

Jun. 7, 1985 [JP] Japan .................................. 60-122526
Oct. 30, 1985 [JP] Japan .................................. 60-241468
Oct. 30, 1985 [JP] Japan .................................. 60-241469
Oct. 30, 1985 [JP] Japan .................................. 60-241470

[51] Int. Cl.[4] .................. G01R 19/00; G01R 33/035; G01R 17/06; A61B 5/04
[52] U.S. Cl. .................................... 324/127; 324/248; 341/133; 505/827; 505/845
[58] Field of Search ...................... 324/248, 990, 71.6, 324/127; 505/842, 843, 845, 827; 341/133

[56] References Cited

U.S. PATENT DOCUMENTS

| | | | |
|---|---|---|---|
| 4,389,612 | 6/1983 | Simmonds et al. | 324/248 |
| 4,496,854 | 1/1985 | Chi et al. | 357/5 X |
| 4,567,438 | 1/1986 | Gershenson et al. | 324/248 |
| 4,646,060 | 2/1987 | Phillips et al. | 307/306 X |
| 4,663,590 | 5/1987 | Gershenson et al. | 324/248 |
| 4,672,359 | 6/1987 | Silver | 324/248 X |

FOREIGN PATENT DOCUMENTS

196480 11/1984 Japan .................................. 324/248

OTHER PUBLICATIONS

Goto, E. et al., "DC Flux Parametron", World Scientific; pub. 1986, pp. 1-55.
Harada, Y. et al., "Basic Operations of the Quantum Flux Parametron", IEEE Trans. on Magnetics, vol. MAG-23, No. 5, Sep. 1987, pp. 3801-3807.
IBM Technical Disclosure Bulletin, Jutzi, "Single-Flux Quantum Memory Cell for NDRO", vol. 17, No. 3, Aug. 1974, pp. 901-902.
Applied Physics Letters, Ketchen et al., "Ultra-Low-Noise Tunnel Junction DC SQUID with a Tightly Coupled Planar Input Coil", vol. 40, No. 8, Apr. 15, 1982, pp. 736-738.
Electronics, Moore, "Lock-In Amplifiers Signals Buried in Noise", Jun. 8, 1982, pp. 40-43.
Arbel, A., "Analog Signal Processing and Instrumentation", pub. 1980, pp. 235-239.
Gheewala, T., "Josephson-Logic Devices and Circuits", IEEE Trans. on Electron Devices, vol. ED-27, No. 10, Oct. 1980, pp. 1857-1869.
Clarke, J., "Advances in SQUID Magnetometers", IEEE Trans. on Electron. Devices, vol. ED-27, No. 10, Oct. 1980, pp. 1896-1908.
Hamilton, C. et al., "Analog Measurement Applications for High Speed Josephson Switches", IEEE Trans. on Magnetics, vol. MAG-17, No. 1, Jan. 1981, pp. 577-582.

*Primary Examiner*—Jerry Smith
*Assistant Examiner*—Stephen M. Baker
*Attorney, Agent, or Firm*—Antonelli, Terry & Wands

[57] ABSTRACT

A superconducting current detecting circuit which comprises a reference current generation circuit for generating a reference current and a DC flux parametron circuit for comparing an input current to be detected with the reference current to thereby produce pulses in synchronism with an input excitation signal, the number of the pulses being varied in accordance with a difference between the input current and the reference current, the pulses having positive or negative values depending on the polarity of the difference, the reference current generation circuit having means for increasing or decreasing the reference current by a quantity corresponding to the number of the pulses in response to the polarity of the pulses so that reference current generation circuit produces the reference current which agrees with the input current.

13 Claims, 13 Drawing Sheets

SUPERCONDUCTING CURRENT DETECTING CIRCUIT EMPLOYING DC FLUX PARAMETRON CIRCUIT

This application is a continuation of application Ser. No. 869,984, filed June 3, 1986, now abandoned.

BACKGROUND OF THE INVENTION

The present invention relates to a superconducting current detecting circuit suitable for a high-sensitive fluxmeter using a Josephson device.

A fluxmeter using a Josephson device which is called a superconducting quantum interference device (hereinafter referred to as a SQUID fluxmeter), is known in the technical field of a fluxmeter. As the SQUID fluxmeter, a DC-SQUID fluxmeter and an AC-SQUID fluxmeter are typically known, the former being arranged such that magnetic flux interlinked with a superconducting loop constituted by two Josephson junctions and an inductor is measured by changes in maximum DC superconducting current flowing across the superconducting loop, the latter being arranged such that magnetic flux interlinked with a superconducting loop constituted by one Josephson junction and an inductor is measured by changes in maximum AC superconducting current flowing in the superconducting loop. In any one of the conventional SQUID fluxmeters, a main component thereof, is constituted by a passive element for detecting magnetic flux interlinked with the superconducting loop. The SQUID employing a Josephson junction is dipped in liquid helium and an output signal from the SQUID is transferred through a distribution cable to measuring and data processing circuits maintained at a room temperature. The SQUID acts to measure exceedingly weak magnetic flux, and the output signal of the Josephson device per se is weak, so that the signal transferred from the SQUID to the measuring circuit maintained at a room temperature is extremely weak to be, for example, about 1 $\mu$V. Therefore, sensitivity of the conventional SQUID fluxmeter has been limited by thermal agitation noises at a room temperature.

SUMMARY OF THE INVENTION

An object of the present invention is to provide a superconducting current detecting circuit particularly suitable for a high-sensitive fluxmeter which is not limited by external noises.

In order to attain the foregoing object, according to the present invention, by using a DC flux parametron circuit (hereinafter, referred to as a DCFP circuit), an input current to be detected is compared with a reference current or reference signal from a separately provided reference signal generation circuit. On the basis of the value of the reference signal when the current to be detected is coincident with the reference signal, the value of the input current signal is detected. The DCFP circuit using a Josephson junction is an active switching device operated in liquid helium for transmitting a signal through a medium of DC magnetic flux to obtain a high circuit gain.

This DCFP circuit is described in detail in papers in 1984 Symposium of the Institute of Physical and Chemical Research, pages 1 to 3, and pages 48 to 78, and papers in 1985 Symposium of the same, pages 1 to 13. That is, the DCFP circuit is constituted by an amplifying element having high sensitivity for magnetic flux and operated at a very low temperature (a liquid helium temperature), and therefore influence due to the agitation noises on the DCFP circuit is exceedingly small.

The above objects, features and advantages of the present invention will be apparent from the following detailed description taken in conjunction with the accompanying drawings.

DESCRIPTION OF THE PREFERRED EMBODIMENTS

Figure 1:
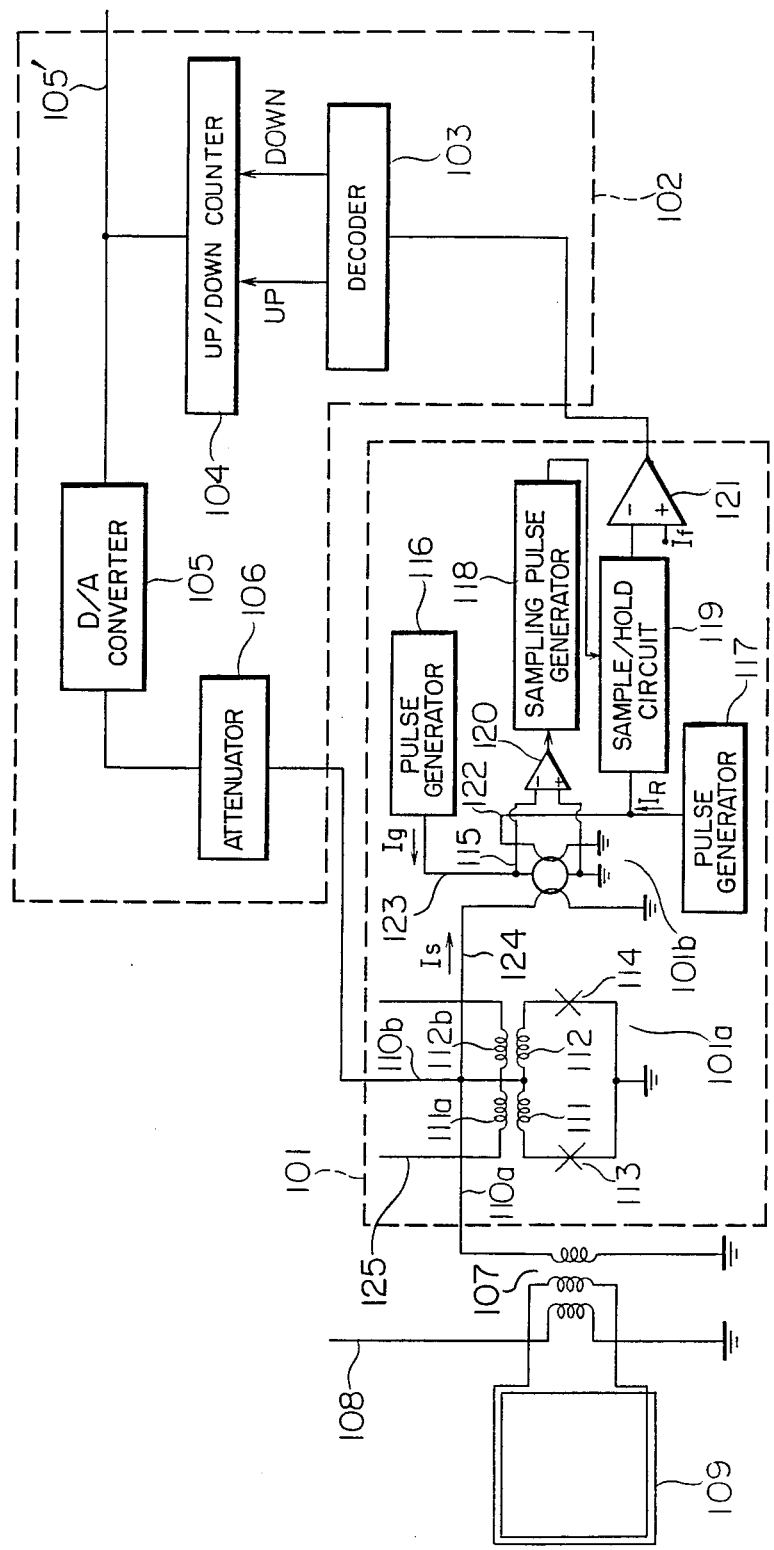
FIG. 1 is a block diagram showing an embodiment of the whole arrangement of the fluxmeter according to the present invention.

FIG. 1 shows a first embodiment of the fluxmeter according to the present invention, in which the illustrated circuit constitutes a feedback loop as a whole. In the drawing, the reference numeral 101 designates a comparator constituted by a DCFP circuit 101a and a current detecting circuit 101b. In the comparator 101, a current signal sensed by a flux antenna 109 and transferred into the comparator 101 through a signal transformer 107 and an input line 110a is compared with a reference signal applied to the comparator 101 through an input line 110b, and a difference between the input current signal and the reference signal is amplified and produced from the comparator 101 as an output thereof.

The DCFP circuit 101a is constituted by Josephson junctions 113 and 114, excitation inductors 111 and 112, an excitation line 125, the input lines 110a and 110b, and an output line 124.

The current detecting circuit 101b is connected to the DCFP circuit 101a through the output line 124 for detecting a current produced from the DCFP circuit 101a.

The reference numeral 115 designates a super-conducting quantum interference device used in the current detecting circuit 101b for receiving a gate current $I_g$ transferred from a pulse generator 116 through a line 123. Further, the superconducting quantum interference device 115 receives an output current $I_s$ transferred from the DCFP circuit 101a through the output line 124 and a scanning current $I_R$ produced from a pulse generator 117 through a line 122. These two currents, the output current $I_S$ and the scanning current $I_R$, function as a current for controlling the maximum superconducting current of the superconducting quantum interference device 115.

The superconducting quantum interference device 115 is switched when the sum of the two currents, that is, the output current $I_S$ and the scanning current $I_R$, has reached a predetermined value, so that an output voltage is generated across the superconducting quantum interference device 115. Upon detection of the output voltage by a differential amplifier 120, a sampling pulse is produced from a sample pulse generation circuit 118 in response to an output of the differential amplifier 120, so that a value of the scanning current $I_R$ when the sum of the two currents, that is, the output current $I_S$ and the scanning current $I_R$, has reached the predetermined value, is held in a sampling and holding circuit 119. A difference between the thus held scanning current $I_R$ and a predetermined control current $I_f$ is obtained by a differential amplifier 121 and the thus obtained difference is produced as a value of the output current from the DCFP circuit 101a.

The reference numeral 102 designates a circuit for generating a reference current signal to be applied to the comparator 101. The reference signal generation circuit 102 is constituted by a decoder 103, an up/down counter 104, a D/A conversion circuit 105, and an attenuator 106.

The decoder 103 is provided for judging a polarity of the reference current signal produced from the comparator 101 and for applying an up-signal or a down-signal to the up/down counter 104 when the polarity is positive or negative respectively.

The up/down counter 104 is connected to the decoder 103 the contents of which represents a value of the reference signal, the contents being increased or decreased in response to the up- or down-signal.

The D/A conversion circuit 105 is arranged o convert the digital signal held in the up/down counter 104 into an analog signal. The attenuator 106 is arranged to attenuate a value of the reference signal.

The flux antenna 109 is arranged to sense magnetic flux to be measured and to apply an input current signal to the input line 110a through the signal transformer 107.

The reference numeral 108 designates a calibration line for calibrating flux sensitivity of the flux antenna 109.

Next, operations of this embodiment will be described.

In the embodiment, in the feedback loop constituted by the reference signal generation circuit 102 and the comparator 101, the polarity of the output signal from the comparator 101 is judged by the decoder 103, so that a value of the reference signal held in the up/down counter 104 is renewed on the basis of the result of judgment by the decoder 103 and the renewed value is fed-back to the comparator 101 through the D/A conversion circuit 105 and the attenuator 106.

Figure 2A:
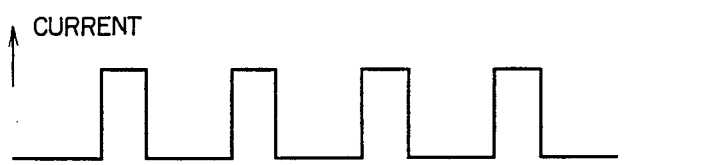
FIGS. 2A, 2B, and 2C are timecharts for explaining operations of the circuits of FIG. 1.
Figure 2B:
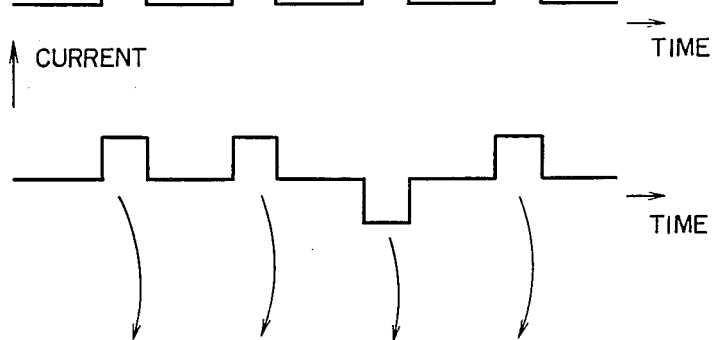
Figure 2C:
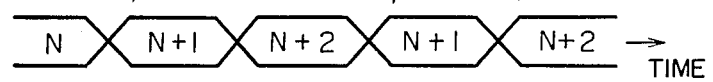

FIGS. 2A, 2B, and 2C are timecharts for explaining the operations of the embodiment.

The dcfp circuit 101a is driven periodically as shown by a waveform of FIG. 2A. FIG. 2B shows a waveform of the output signal from the comparator 101. In this waveform, the positive polarity of the output signal means that the input signal is larger than the reference signal while the negative polarity of the same means that the former is smaller than the latter.

The decoder 103 renews a value of the reference signal in the up/down counter 104 in response to the polarity of the output signal from the comparator 101 at timing as shown by a waveform of FIG. 2C. Here, a value of the reference signal held in the up/down counter 104 is increased (counted up) in the case where the waveform of the output signal from the comparator 101 has a positive polarity, while a value of the reference signal held in the up/down counter 104 is decreased (counted down) when the waveform of the output signal from the comparator 101 has a negative polarity, sc' that the comparator 101 having an arrangement as shown by FIG. 1 becomes stable when the input signal is coincident with the reference signal applied to the comparator 101. As shown in FIG. 2C, assuming that a value of the reference signal held in the up/down counter 104 is N, the value N is increased to N+1 in response to the first pulse of FIG. 2B, further increased to N+2 in response to the second pulse, decreased to N+1 again in response to the third pulse, and increased to N+2 again in response to the fourth pulse.

Here, in order to detect the coincidence between the input signal and the reference signal, for example, a value of the reference signal held in the up/down counter 104 is monitored so that the coincidence is detected when an upper bit of the reference signal has become stable or unchanged. Then, a value of the reference signal when the coincidence between the input and reference signals has been detected is derived through a signal line 105'.

In this control system, a ratio of the output signal to the input signal, that is, a circuit gain, can be made large if an attenuation factor of the attenuator 106 is made large, however, a gain of the feedback loop becomes small, so that the response of the circuit becomes slow.

Figure 3A:
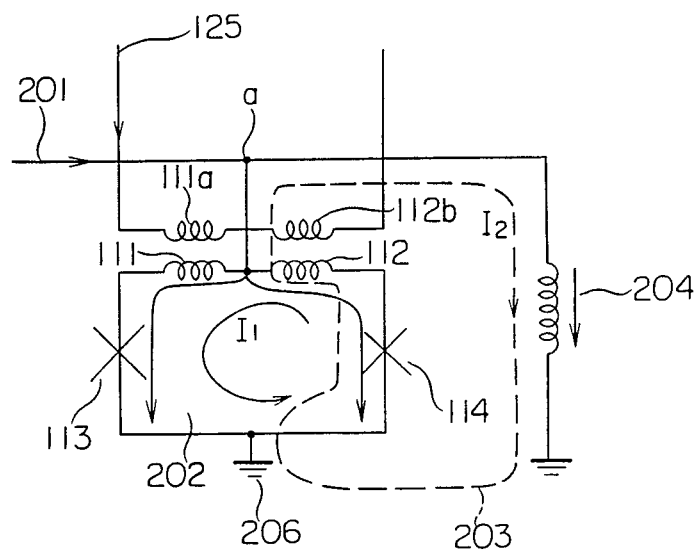
FIGS. 3A and 3B are diagrams for explaining an operation of the DCFP circuit used in the comparator according to the present invention.
Figure 3B:
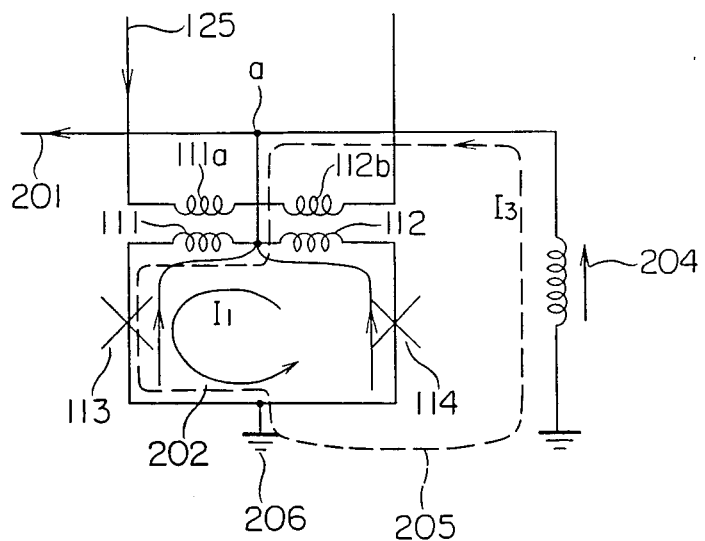

FIGS. 3A and 3B are diagrams for explaining the operation of the DCFP circuit 101a of FIG. 1.

This DCFP circuit 101a is constituted by a superconducting loop 202 constituted by two Josephson junctions 113 and 114 and two inductors 111 and 112, and an excitation line 125 including a series connection of inductors 111a and 112b magnetically coupled with the inductors 111 and 112 respectively. In the DCFP circuit 101a, an input signal current is applied to the superconducting loop 202 through an input line 201. A difference between the currents flowing in the input line 110a and the output line 110b of FIG. 1 is applied to the DCFP circuit 101a as the input signal current.

First, as shown in FIG. 3A, if the input signal current flows rightward in the input line 201 in the drawing, this input signal current flows into one path constituted by the inductor 111 and the Josephson junction 113 and the other path constituted by the inductor 112 and the Josephson junction 114. An excitation current is caused to flow in the excitation line 125 in the direction of an arrow shown in FIG. 3A, so that a circulating current $I_1$ flows in the superconducting loop 202 by the inductor 111 magnetically coupled with the inductor 111a, and the inductor 112 magnetically coupled with the 112b in the direction to cancel magnetic flux generated by this excitation current and as a result the current flowing in the Josephson junction 113 is increased while the current flowing in the Josephson junction 114 is decreased. Then, when the current flowing in the Josephson junction 113 exceeds the maximum superconducting current, the Josephson junction 113 is shifted into a voltage mode, so that the circulating current I which has flowed in the superconducting loop 202 is commutated into a superconducting loop 203, and consequently flows downward in the drawing in a load inductor 204 as shown in FIG. 3A.

Next, as shown in FIG. 3B, when the input signal current flows leftward in the input line 201 in the drawing, the input signal current flows into one path by the Josephson junction 113 and the inductor 111 and the other path constituted by the Josephson junction 114 and the inductor 112, so that the input signal current flows from the earth 206 to a node a. An excitation current is caused to flow in the excitation line 125 in the direction of an arrow shown in FIG. 3B, so that the circulating current $I_1$ flows in the superconducting loop 202 in the direction to cancel magnetic flux generated by this excitation current, and as a result the current flowing in the Josephson junction 113 is decreased while the current flowing in the Josephson junction 114 is increased. Then, when the current flowing in the Josephson junction 114 exceeds the maximum superconducting current, the Josephson junction 114 is shifted to the voltage mode, so that the circulating current $I_1$ which has flowed in the superconducting loop 202 is commutated into a superconducting loop 205, and consequently a circulating current $I_3$ flows through the Josephson junction 113, the earth 206, the load inductor 204, the node a, and the inductor 111, so that the circulating current $I_3$ flows upward in the load inductor 204 as shown in FIG. 3B.

Thus, the input current is amplified by the excitation current flowing in the excitation line 125 and the thus amplified current flows into the load inductor 204 as an output current of the DCFP circuit 101a. In this case, the flowing direction of the output current is determined depending on the flowing direction of the input current. That is, this DCFP circuit 101a performs such an operation that the input signal is amplified by the excitation current (the excitation electric power) in the positive or negative direction determined depending on the polarity of the input signal acting as a pilot signal.

Figure 4A:
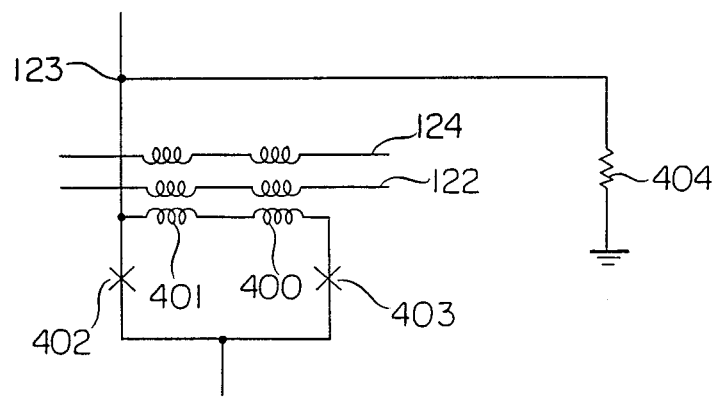
FIGS. 4A and 4B are diagram showing a circuit arrangement and characteristics of the superconducting quantum interference device used in the comparator according to the present invention respectively.
Figure 4B:
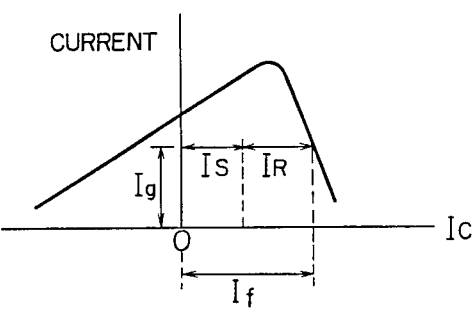

Next, referring to FIGS. 4A and 4B, description will be made as to the superconducting quantum interference device 115 used as a current detector in the 101b of FIG. 1. FIG. 4A shows a circuit arrangement of the superconducting quantum interference device 115, in which two Josephson junctions 402 and 403, and two inductors 400 and 401 constitute a superconducting loop. A gate current is applied to the superconducting loop through the gate line 123. Two control lines 124 and 122 are provided in the vicinity of the superconducting loop. The respective magnetic flux generated by the currents flowing in the control lines 124 and 122 are interlinked with the superconducting loop, so that the currents on control lines 124 and 122 control the maximum superconducting current of the superconducting quantum interference device 115. Further, a dumping resistor 404 is connected to an output of the superconducting quantum interference device 115. In the superconducting quantum interference device 115 in the current detecting circuit 101b, a current $I_s$ to be measured is caused to flow into the first control line 124 and a scanning current $I_R$ is caused to flow into the second control line 122. FIG. 4B shows the threshold characteristics of the superconducting quantum interference device 115. In this drawing, if the value of the gate current applied to the superconducting quantum interference device 115 is fixed to a value $I_g$, the value of a control current $I_f$ required for switching the superconducting quantum interference device 115 from a superconducting mode to a voltage mode is directly determined, and it is apparent that this control current $I_f$ is equal to the sum of the current $I_s$ and the scanning current $I_R$. Accordingly, if the current $I_R$ is scanned and a value of the current $I_R$ when the superconducting quantum interference device 115 is switched is sampled, a value of the current $I_s$ can be obtained on the basis of the sampled value of the current $I_R$. Accordingly, it is possible to obtain a value of the current $I_s$ to be measured on the basis of the reference current $I_R$ in the current detecting circuit 101b.

Figure 5A:
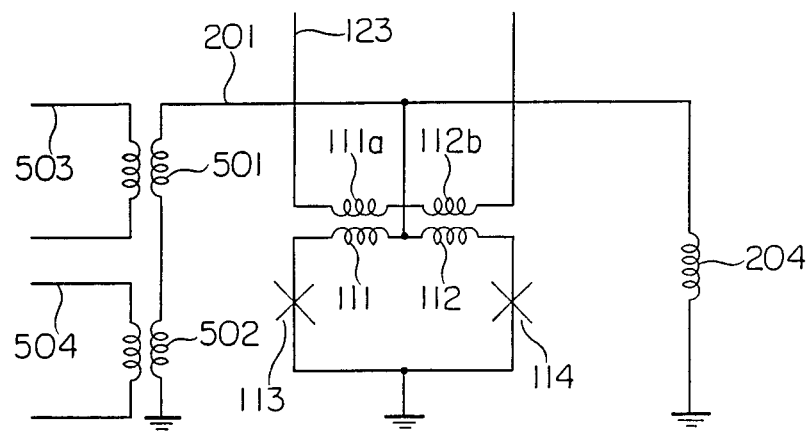
FIGS. 5A and 5B are diagrams for explaining a way how to use the DCFP circuit as the comparator.
Figure 5B:
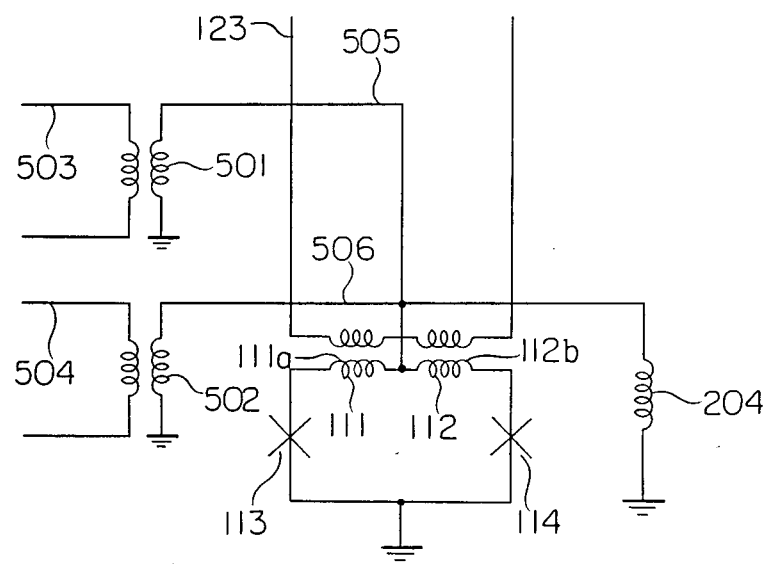

FIGS. 5A and 5B show a way how to use the DCFP circuit 101a as a comparator. The circuit shown in FIG. 5A is arranged such that a reference signal transformer 501 and an input signal transformer 502 is connected in series with the input line 201 of the DCFP circuit 101a of FIG. 3. A difference between the input flux received through an input line 504 and reference flux received through a reference signal line 503 is applied to the DCFP circuit 101a as input flux thereto and the input flux is amplified by the excitation current on the basis of the direction of this input flux acting as a pilot signal. FIG. 5B shows another way how to use the DCFP circuit 101a as a comparator. The circuit shown in FIG. 5B is arranged such that a reference signal transformer 501 and an input signal transformer 502 are connected in parallel to the DCFP circuit 101a through input lines 505 and 506 respectively. A difference signal between an input signal received through an input line 504 and a reference signal received through an input line 503 is applied to the input line 201 of FIG. 3 as an input signal to the DCFP circuit 101a shown in FIG. 3.

Figure 6:
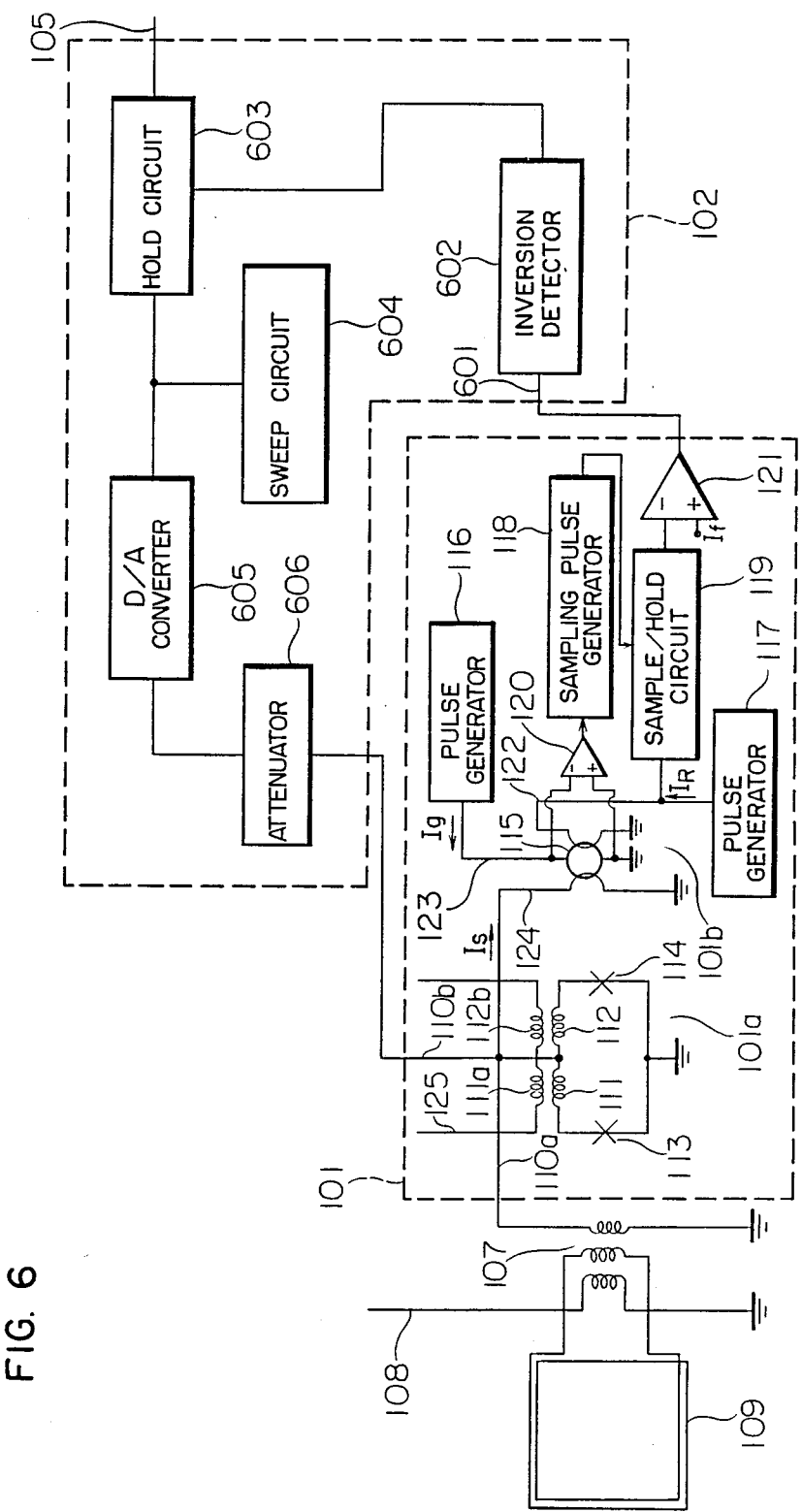
FIG. 6 is a block diagram showing another embodiment of the whole circuit arrangement of the fluxmeter according to the present invention.

FIG. 6 shows a second embodiment of the fluxmeter according to the present invention, in which the illustrated circuit constitutes a feedforward system as a whole. A comparator 101 and a flux antenna 109 have the same structures as the comparator 101 and the flux antenna 109 of FIG. 1 respectively. A reference signal generation circuit 102 is constituted by an inversion detecting circuit 602, a holding circuit 603, a signal sweep circuit 604, a D/A conversion circuit 605, and an attenuator 606.

The inversion detecting circuit 602 generates an inversion signal when the polarity of the waveform of an output signal from the comparator 101 is changed from positive to negative.

The signal sweep circuit 604 causes the reference signal generation circuit 102 to generate a reference signal the value of which is increased by one unit for every period.

The holding circuit 603 holds a value of the reference signal when the inversion signal is produced from the inversion detecting circuit 602 and produces the value of the reference signal externally through an output line 105.

FIGS. 7A, 7B, 7C, and 7D show timecharts of operations of the circuits of FIG. 6.

Figure 7A:
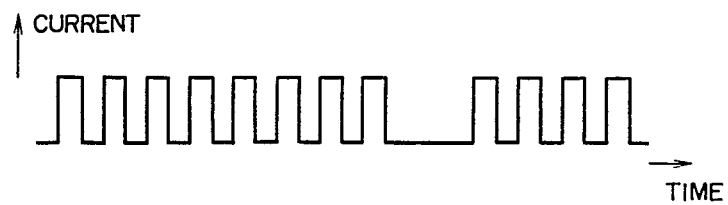
FIGS. 7A, 7B, 7C and 7D are timecharts for explaining operations of the circuits of FIG. 6.

A DCFP circuit 101a of the comparator 101 is driven in synchronism with the period of the signal sweep circuit 604 as shown by a waveform of FIG. 7A.

Figure 7B:
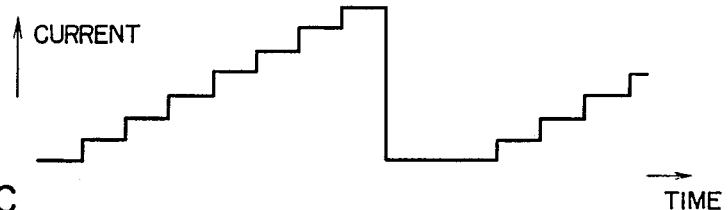

Since the output signal of the signal sweep circuit 604 is applied to the D/A conversion circuit 605, the output signal of the D/A conversion circuit 605 has a stepwise sweep waveform as shown in FIG. 7B. This stepwise sweep waveform is applied to the comparator 101 through the attenuator 606 as a reference signal thereto.

Figure 7C:
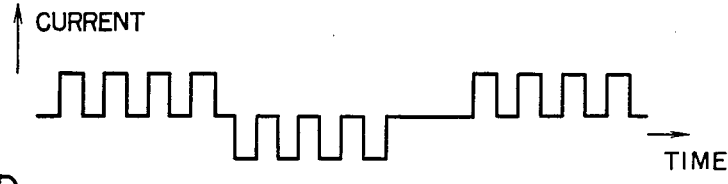
Figure 7D:

FIG. 7C shows a waveform of an output signal from the comparator 101. In this waveform, the positive polarity of the output signal represents that the input signal of the comparator 101 is larger than the reference signal while the negative polarity of the same represents that the input signal is smaller than the reference signal. When the point in time when the polarity of the waveform of the output signal from the comparator 101 is changed from positive to negative is detected by the inversion detecting circuit 602, a value of the reference signal at that time is equal to a value of the input signal. Therefore, at the point in time when the polarity is changed from positive to negative, the inversion signal as shown in FIG. 7D is produced from the inversion detecting circuit 602 to the holding circuit 603, so that a value of the reference signal at that time is held by the holding circuit 603.

Figure 8:
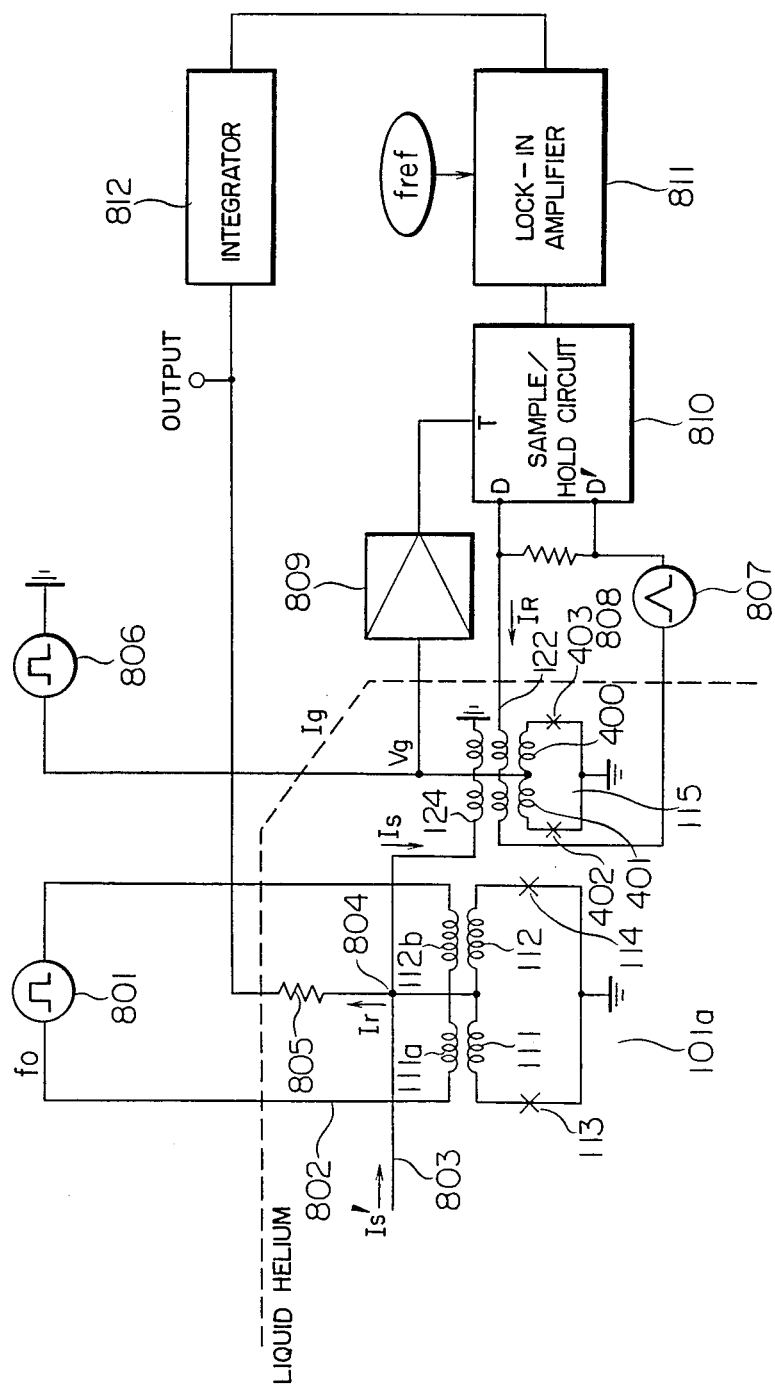
FIG. 8 is a block diagram showing a further embodiment of the whole circuit arrangement of the fluxmeter according to the present invention.

FIG. 8 shows another embodiment for the formation of a feedback loop.

In the embodiment of FIG. 8, an output current $I_s$ from a DCFP circuit 101a is sensed by a superconducting quantum interference device 115 as shown in FIG. 4A. That is, an output signal corresponding to the output current $I_s$ from the DCFP circuit 101a is measured by the superconducting quantum interference device 115 through a control line 124. A gate current $I_g$ is applied to the superconducting quantum interference device 115 from a current source 806 and further a current $I_R$ is applied to a second control line 123 of the superconducting quantum interference device 115 from a current source 807 through a resistor 808, so that a voltage proportional to the current $I_R$ is applied to a sampling and holding circuit 810 through the resistor 808 as a data input signal. An output signal voltage $V_g$ from the superconducting quantum interference device 115 is amplified by an amplifier 809 and the amplified voltage is used as a trigger signal of the sampling and holding circuit 810.

An excitation frequency component $f_0$ is extracted out of the output of the sampling and holding circuit 810 by a lock-in amplifier 811 and a voltage having a frequency corresponding to the excitation frequency component $f_0$ of the output signal is integrated by an integrator 812. An output of the integrator 812 is converted into a current through a resistor 805 and the current is fed-back to the DCFP circuit 101a as the reference current $I_r$.

Figure 9:
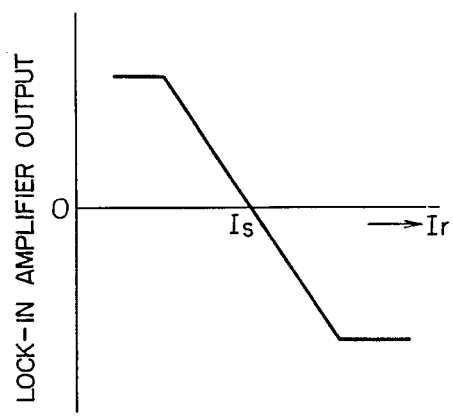
FIG. 9 is a diagram for explaining characteristics of the lock-in amplifier 811 of FIG. 8

FIG. 9 shows the output characteristics of the lock-in amplifier 811. The output of the lock-in amplifier 811 is positive, negative or zero when the reference current $I_r$ is smaller than, larger than, or equal to the signal $I_s'$, respectively. It is apparent that the polarity of the output signal from the lock-in amplifier 811 can be easily inverted by using an inverter circuit, and therefore in this embodiment, it is assumed that the output signal from the lock-in amplifier 811 is arranged to have a polarity inverse to that of the input signal. Accordingly, if the reference current of the DCFP circuit 101a is made to have a value proportional to the output of the lock-in amplifier 811, it is possible to constitute a feedback system which converges so that the signal current $I_s'$ becomes equal to the reference current $I_r$. Therefore, a current comparator of high performance can be constituted by using the characteristics shown in FIG. 9.

It is preferable to dispose the whole or a part of the resistor 805 in a place of an exceedingly low temperature (for example, in liquid helium) in order to suppress thermal agitation noises at a room temperature. In the circuit arrangement shown in FIG. 8, the feedback is performed on the basis of the characteristics of FIG. 9 so that the input current $I_s'$ is agreed with the reference current $I_r$, and a change in the input current $I_s'$ is followed by a change in the reference current $I_r$. Therefore, the value of the input current $I_s'$ is agreed with the reference current $I_r$, and this value can be detected by monitoring the output voltage of the integrator 812.

FIGS. 10A, 10B, 10C, 10D, and 10E are for explaining the operations of the superconducting quantum interference device 115 and the sampling and holding circuit 810 shown in FIG. 8.

Figure 10A:
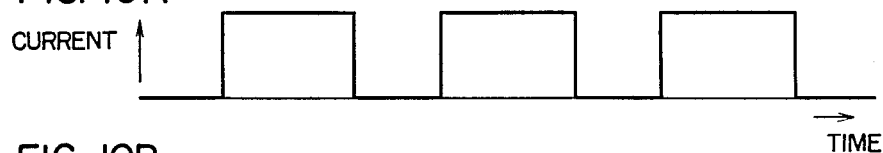
FIGS. 10A, 10B, 10C, 10D, and 10E are timecharts for explaining operations of the circuits of FIG. 8.
Figure 10B:
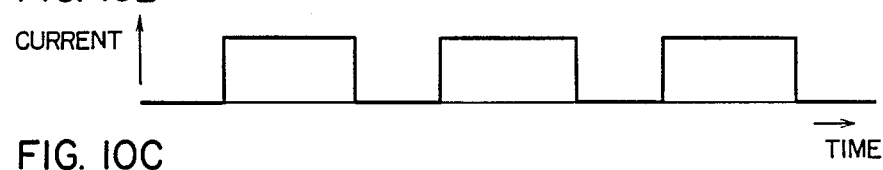
Figure 10C:
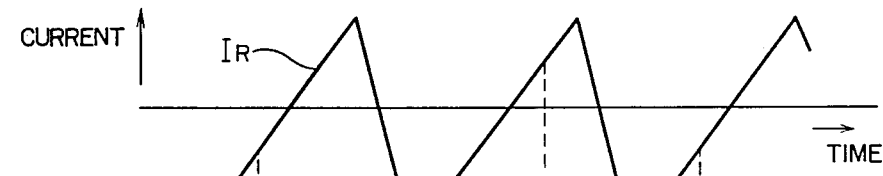
Figure 10D:
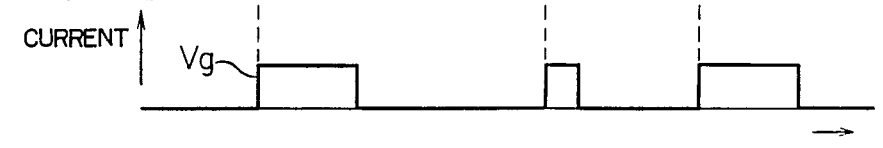
Figure 10E:
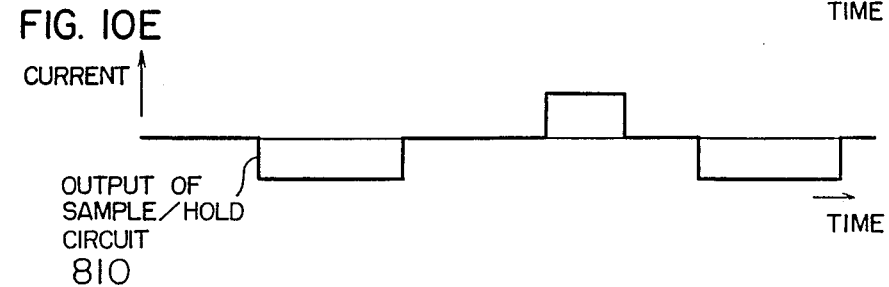

The DCFP circuit 101a is driven by a positive unipolar pulse current from the excitation current source 801 as shown in FIG. 10A, and simultaneously, the superconducting quantum interference device 115 is excited by the positive unipolar pulse current as indicated in FIG. 10B supplied from a current supply source 806. The current $I_R$ is swept from negative to positive in such a sawtooth waveform as shown in FIG. 10C. FIG. 10D shows a waveform of the output voltage $V_g$ of the superconducting quantum interference device 115. The timing for switching the output voltage $V_g$ is changed depending on the value of the output current $I_s$ from the DCFP circuit 101a. The sampling and holding circuit 810 takes-in a value of the current $I_R$ in response to a leading edge of the voltage $V_g$ as shown in FIGS. 10C and 10D and produces an output signal as shown in FIG. 10E. In the embodiment of FIG. 8 according to the present invention, a signal corresponding to the output signal from the DCFP circuit 101a is taken into the sampling and holding circuit 810 by the operations explained in FIGS. 10A through 10E, and feedback so that the DCFP circuit 101a operates as a current comparator.

In the embodiment of FIG. 8, unlike the embodiment of FIG. 1, it is not necessary to effect digital adding-/subtracting operations because all the signal processings are performed in an analog mode. Therefore, in the fluxmeter of FIG. 8, it is possible to cover a wide signal frequency region and to respond to high-speed signals.

Figure 11:
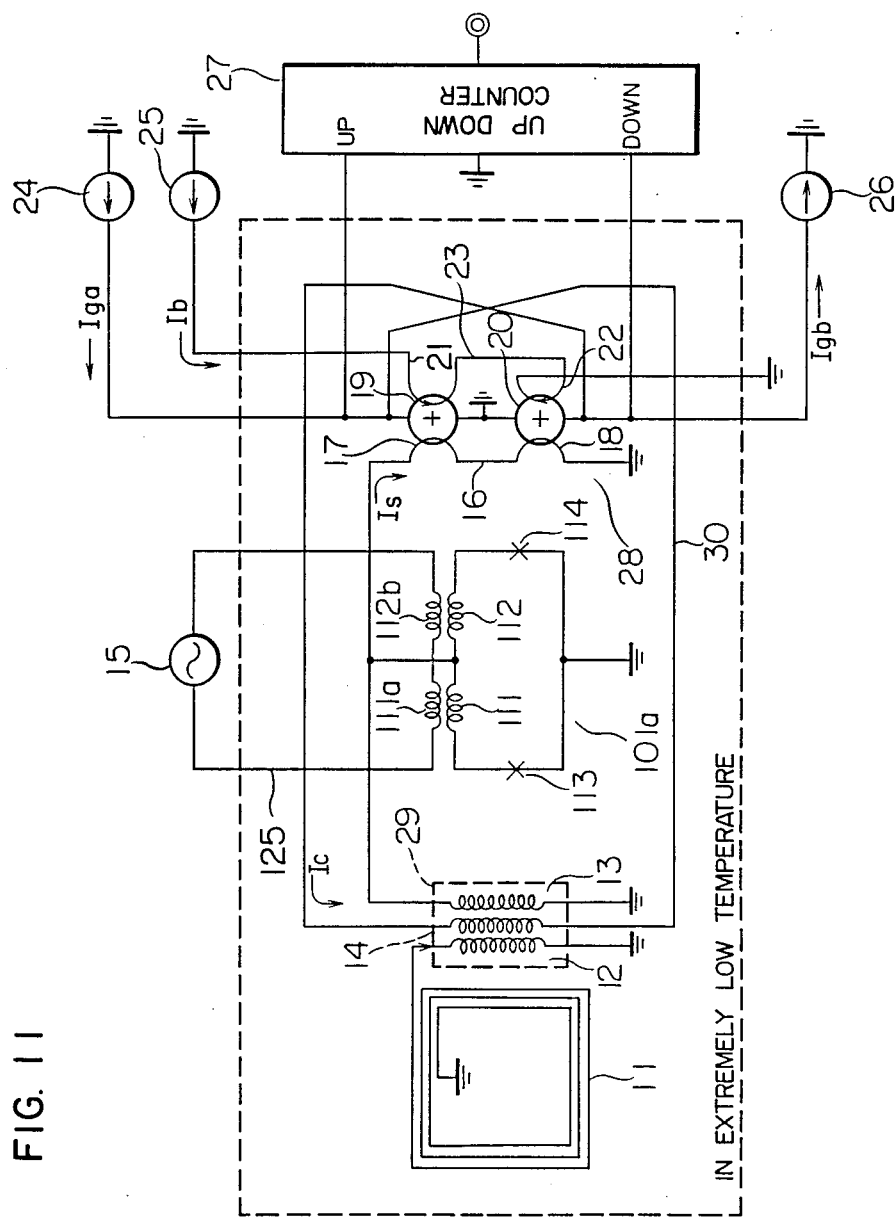
FIG. 11 is a block diagram showing a still further embodiment of the whole circuit arrangement of the fluxmeter according to the present invention.

FIG. 11 shows a further embodiment of the fluxmeter according to the present invention. This embodiment has a feedback circuit constituted by Josephson devices, and employs an accumulative operation circuit of the type in which a circulating current is accumulated in a superconducting loop. Accordingly, it is not necessary to provide an elongated cable for connecting devices disposed in a place of an exceedingly low temperature to devices disposed in a place of a room temperature, so that it is possible to eliminate a time delay due to an elongated cable.

The circuit shown in FIG. 11 is constituted by a pickup coil 11 for sensing magnetic flux to be measured, a DCFP circuit 101a, and an accumulative operation circuit 28 constituted by a first and a second DC current source 24 and 26, a first and a second superconducting quantum interference devices 19 and 20, and an inductor 14. A flux magnetic signal sensed by the pickup coil 11 is applied to the DCFP circuit 101a through flux coupling between windings 12 and 13 of a transformer 29. The DCFP circuit 101a is driven by an excitation current periodically applied from an AC current source 15 through an excitation line 125, and the direction of an output current $I_s$ of the DCFP circuit 101a depends on that of an input signal of the DCFP circuit 101a.

The output current $I_S$ from the DCFP circuit 101a flows into a load line 16 which is connected to control lines 17 and 18 of the respective superconducting quantum interference devices 19 and 20 so that the current $I_S$ is detected by the first and second superconducting quantum interference devices 19 and 20. The control currents flowing in the respective control lines 17 and 18 of the superconducting quantum interference devices 19 and 20 are nothing else but to the output current $I_S$ from the DCFP circuit 101a. In the circuit of FIG. 11, in order to cause the accumulative operation circuit 28 to correctly effect adding/subtracting operations, a current $I_b$ is applied to the first and second superconducting quantum interference devices 19 and 20 through second control lines 21 and 22, a lead wire 23, and a DC source 25. The accumulative operation circuit 28 accumulates the number of positive or negative pulses from the DCFP circuit 101a and stores the accumulated number as information representing a value of a current $I_c$ flowing in the inductor 14. In this embodiment, the inductor 14 is constituted by a winding of the transformer 29, so that magnetic flux generated by the current $I_c$ is fed-back to the DCFP circuit 101a through the winding 13 of the transformer 29. The direction of the current flowing in the inductor 14 is selected such that the magnetic flux generated by the current $I_c$ is negatively fed-back. In the circuit shown in FIG. 11, as described above, the accumulative operation circuit 28 performs the adding/subtracting operations corresponding to the direction of the output current from the DCFP circuit 101a to accumulate the results as the circulating current to perform a feedback operation such that a balanced state is reached when magnetic flux generated by the circulating current is agreed with magnetic flux sensed by the pickup coil 11. All the pickup coil 11, the DCFP circuit 101a, the accumulative operation circuit 28, and the feedback system are disposed in a place of an extremely low temperature, such as in liquid helium. The respective output voltages of the first and second superconducting quantum interference devices 19 and 20 in the accumulative operation circuit 28 are connected to an up/down counter 27 in a place of a room temperature, so as to monitor the accumulated value of the accumulative operation circuit 28. That is, this up/down counter 27 counts up the number of output pulses from the superconducting quantum interference device 19 while counts down the number of output pulses from the superconducting quantum interference device 20, so that the output of the up/down counter 27 is proportional to the current $I_c$, and therefore proportional to the magnetic flux sensed by the pickup coil 11.

Figure 12:
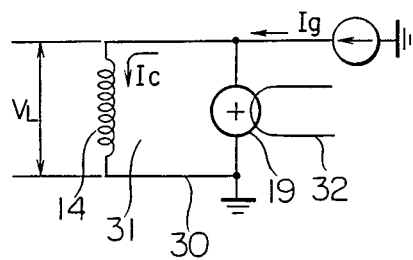
FIG. 12 and FIGS. 13A, and 13B are diagrams for explaining an operational principle of the circuit of FIG. 11.

FIG. 12 is a diagram for explaining the principle of the accumulative operation circuit 28 used according to the present invention. In this accumulative operation circuit 28, a gate current $I_g$ is applied from the DC current source 24 to a superconducting loop 31 arranged such that the inductor 14 is connected across the superconducting quantum interference device 19 through a lead wire 30.

Next, the operation of the accumulative operation circuit 28 shown in FIG. 12 will be described. If the inductance value of the inductor 14 is large, most of the gate current $I_g$ flows not into the inductor 14 but into the superconducting quantum interference device 19 at the point in time when the power supply for the accumulative operation circuit 28 is turned on. In this state, a control current is caused to flow in a control line 32 of the superconducting quantum interference device 19, so that the superconducting quantum interference device 19 is shifted to a voltage mode, and a voltage $V_L$ is produced across the inductor 14. Therefore, the circulating current $I_c$ flows in inductor 14 through the superconducting quantum interference device 19. The circulating current $I_c$ is represented by the following expression (1).

$$I_c = \frac{1}{L} \int V_L dt \qquad (1)$$

As apparent from the expression (1), the circulating current $I_c$ is an integrated or accumulated value of a voltage generated across the inductor 14. Therefore, in the case where a plurality of pulse signals are applied to the control signal line 32, the circulating current $I_c$ is proportional to the number of applied pulses, so that the circuit shown in FIG. 12 indicates a counted or accumulated value of the pulses applied to the control signal line 32. In the circuit arrangement shown in FIG. 12, the inductor 14 and the superconducting quantum interference device 19 are connected to each other through a superconducting line to constitute a superconducting loop, so that the voltage across the inductor 14 is nothing else but the output voltage of the superconducting quantum interference device 19. Being connected to the load inductor 14, the superconducting quantum interference device 19 is returned to a superconducting mode in which the voltage across the superconducting quantum interference device 19 becomes zero in a stationary state, even if the superconducting quantum interference device 19 is temporarily shifted into a voltage mode. The value and waveform of the voltage produced by the superconducting quantum interference device 19 when it is in the voltage mode can be changed by suitably selecting a resistance value of a dumping resistor of the superconducting loop 31.

Figure 13A:
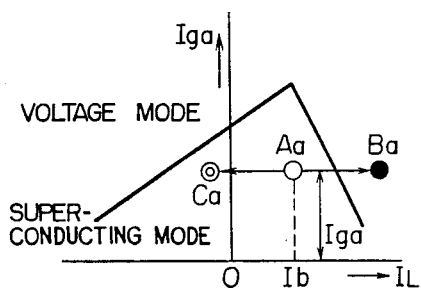
Figure 13B:
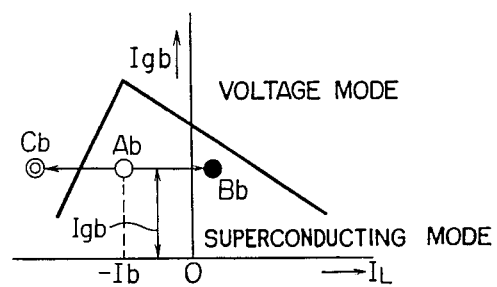

FIGS. 13A and 13B show the operating points of the first and the second superconducting quantum interference devices 19 and 20, respectively. Each of the drawings is a characteristic diagram showing a so-called threshold characteristic of a superconducting quantum interference device for distinguishing the operation mode between a superconducting mode and a voltage mode from each other. In the embodiment of FIG. 11, the value of the maximum superconducting current of each of the two Josephson junctions 402 and 403 of the superconducting quantum interference device shown in FIG. 4A and the inductance value of each of the two inductors 401 and 400 are selected in an optimum manner. For example, in the embodiment shown in FIG. 11, the characteristics of the Josephson junctions and the inductors are selected so that the first and second superconducting quantum interference devices 19 and 20 have a rightward-up threshold characteristic and a leftward-up threshold characteristic with respect to the control current, as shown in FIGS. 13A and 13B respectively.

The superconducting quantum interference devices 19 and 20 are supplied with gate currents $I_{ga}$ and $I_{gb}$ from the DC current sources 24 and 26 respectively. In FIGS. 13A and 13B, in the case where the DCFP circuit 101a is not driven and the output current $I_s$ thereof is zero, the respective operating points of the superconducting quantum interference devices 19 and 20 are in the points $A_a$ and $A_b$. That is, both the superconducting quantum interference devices 19 and 20 are in the superconducting mode. Therefore, the accumulating operation is not executed at this point in time. Next, when the DCFP circuit 101a is driven and the output current $I_s$ flows, for example, in the positive direction, the respective operating points of the superconducting quantum interference device 19 and 20 are shifted to the points $B_a$ and $B_b$. That is, the first superconducting quantum interference devices 19 is shifted to the voltage mode while the second superconducting quantum interference device 20 is left in the superconducting mode. As a result, the accumulative operation circuit 28 executes an adding operation. Similarly to this, if the output current from the DCFP circuit 101a flows in the negative direction, the respective operating points of the superconducting quantum interference devices 19 and 20 are shifted to the points $C_a$ and $C_b$, so that the accumulative operation circuit 28 executes a subtracting operation.

In the case where the output current of the DCFP circuit 101a is detected in the current detecting circuit 101b employing a superconducting quantum interference device 115, an error operation may be caused by the influence of this current detecting circuit 101b so that a signal polarity of the DCFP circuit 101a is inverted to destroy information. Accordingly, it is necessary to eliminate the influence of the current detecting circuit 101b.

Figure 14A:
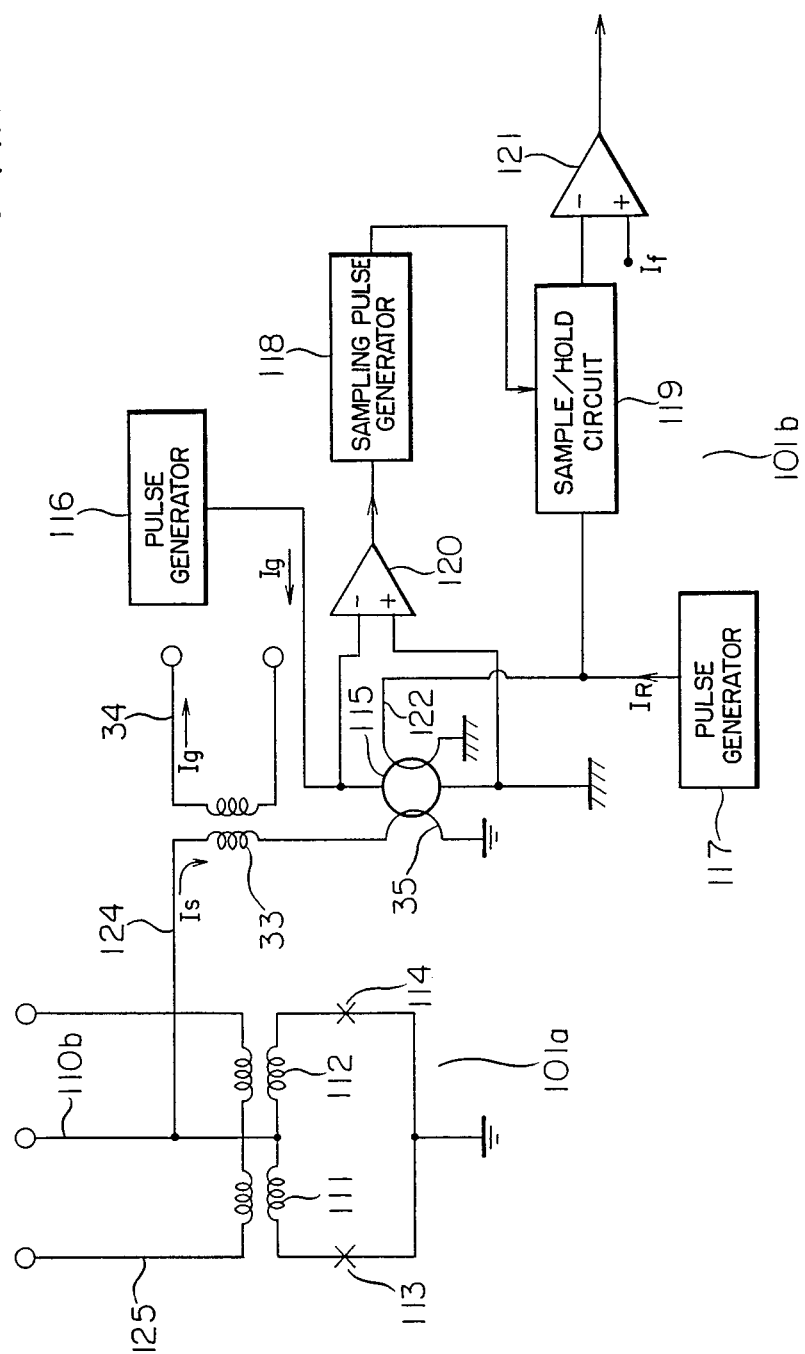
FIGS. 14A and 14B are diagram showing modifications of the current detecting circuit 101b of FIG. 1 respectively.

The influence of the current detecting circuit 101b is as follows. That is, the current (for example, the gate current $I_g$) caused to flow in the current detecting circuit 101b flows in the direction opposite to the output current of the DCFP circuit 101a through transformer coupling to thereby invert the direction of the output current of the DCFP circuit 101a. In order to eliminate this influence onto the DCFP circuit 101a, it will do to additionally provide a circuit for cancelling the influence of the current detecting circuit 101b as shown in FIG. 14A. In FIG. 14A, a transformer 33 and a control line 35 of the 101b are connected to the DCFP circuit 101a as a load inductor thereof.

In this circuit arrangement, a cancelling current $I_g'$ is caused to flow in the transformer 33 through a lead wire 34 in the direction opposite to the gate current $I_g$ and the reference current $L_R$ so that the magnetic flux superimposed on the control line 35 by the gate current $I_g$ and the reference current $I_R$ can be cancelled by the cancelling current $I_g'$. The cancelling current $I_g'$ may be selected to have an optimum value in accordance with the gate current $I_g$, the reference current $I_R$ and a coupling coefficient of the transformer 33.

Figure 14B:
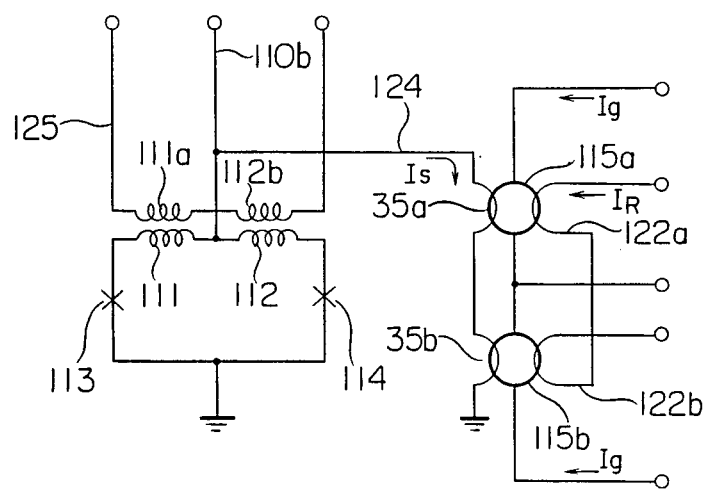

FIG. 14B shows a circuit arrangement of another method of eliminating the influence on to the DCFP circuit, in which two current detecting circuits are differentially operated. That is, the circuit of FIG. 14B is arranged such that two current detecting circuits 115a and 115b are connected to the DCFP circuit 101a as a load thereof so as to perform a differential operation such that the gate current $I_g$ flows in the direction opposite to the reference current $I_R$. In this arrangement, the respective magnetic flux generated by the two current detecting circuits 115a and 115b are cancelled to each other, and the current detecting circuits give no reaction to the DCFP circuit 101a. In this case, only one of the two current detecting circuits 115a and 115b is effectively used for the current detection while the other is not used.

Although only one DCFP circuit is used in the comparator in the foregoing embodiments, a plurality of DCFP circuits may be connected in series to each other so as to constitute the comparator.

According to the present invention, it is possible to derive a weak flux signal into measuring and processing devices disposed in a place of a room temperature, after the flux signal has been amplified in liquid helium. Thus, a high-sensitive fluxmeter which is not affected by thermal agitation noises is effectively constituted by the DCFP circuit according to the present invention. This fluxmeter is useful for the measurement of a weak magnetic field, for example, for the measurement of magnetic field generated in a human body.

We claim:

1. A superconducting current detecting circuit comprising:

a reference current generation circuit for generating a reference current; and a DC flux parametron circuit for comparing an input current to be detected with said reference current to thereby produce pulse currents in synchronism with an input excitation signal, the number of said pulse currents being varied in accordance with a difference between said input current and said reference current, said pulse currents having positive or negative values depending on the polarity of said difference;

wherein said reference current generating circuit includes means for increasing or decreasing said reference current by a quantity corresponding to the number of said pulse currents in response to the polarity of said pulse currents so that said reference current generation circuit produces said reference current which agrees with said input current; and wherein said DC flux parametron circuit is constituted by;

an excitation line including a series connection of a first and second inductor to which said input excitation signal is applied, a superconducting loop including a series connection of a third inductor magnetically coupled with said first inductor, a fourth inductor magnetically coupled with said second inductor, and a first and a second Josephson junction, an input line connected with a first connecting point between said third and fourth inductors to which said difference between said input current and said reference current is applied, and a load inductor connected between said first connecting point and a second connecting point between said first and second Josephson junctions, said second connecting point being earthed, and said pulse currents flowing through said load inductor.

2. A superconducting current detecting circuit according to claim 1, in which said reference current generation circuit is provided with means for holding said reference current, and means for controlling said reference current held in said holding means to be increased/decreased in response to said positive or negative values of said pulse currents produced as the result of comparison.

3. A superconducting current detecting circuit according to claim 1, further comprising a superconducting circuit connected to said DC flux parametron circuit and provided with a superconducting quantum interference device for detecting an output current of said DC flux parametron circuit.

4. A superconducting current detecting circuit according to claim 3, further comprising means for superimposing magnetic flux onto an output signal line of said DC flux parametron circuit to thereby cancel magnetic flux generated on said output signal line due to an operation current caused to flow into said superconducting quantum interference device.

5. A superconducting current detecting circuit according to claim 4, in which said flux superimposing means is constituted by a transformer-coupled element magnetically connected with said output signal line and for causing a current of a value corresponding to said operation current caused to flow into said superconducting quantum interference device.

6. A superconducting current detecting circuit according to claim 4, in which said flux superimposing means is constituted by another superconducting quantum interference device which has the same structure as said first-mentioned superconducting quantum interference device and into which another operation current is caused in the direction opposite to said first-mentioned operation current.

7. A superconducting current detecting circuit according to claim 1, in which said reference current generation circuit includes means for extracting a component of a frequency integer times as large as a frequency of said excitation current out of said positive or negative pulse currents and for controlling said reference current in proportion to the extracted component.

8. A superconducting current detecting circuit according to claim 7, in which said extracting and controlling means includes a lock-in amplifier to which an output pulse current of said DC flux parametron circuit is applied, and from which a reference signal having a frequency integer times as large as a frequency of said excitation current is produced.

9. A superconducting current detecting circuit according to claim 1, in which said reference current generation circuit includes means or supplying said DC flux parametron circuit with a superconducting circulating current, as said reference current, in proportion to a difference between respective accumulated values of said positive and negative pulse currents in response to said positive or negative pulse currents.

10. A superconducting current detecting circuit according to claim 9, in which said superconducting current supply means includes a superconducting loop through which said circulating current is caused to flow, said loop being constituted by superconducting quantum interference devices and an inductor, an output current of said DC flux parametron acting as a control current for said superconducting quantum interference device.

11. A superconducting current detecting circuit according to claim 1, further comprising means for receiving magnetic flux to be detected so as to supply said DC flux parametron with a current, as said input a value of said magnetic flux to be detected.

12. A superconducting current detecting circuit comprising:
means for generating a reference current which changes with time;
a DC flux parametron circuit for comparing an input current to be detected with said reference current to thereby produce a pulse current in synchronism with an input excitation signal, said pulse current having a value which is positive or negative depending on the polarity of a difference between said input current and said reference current;
means for detecting a change in polarity of said pulse current produced from said DC flux parametron; and
means for outputting a value of said reference current generated by said reference current generating means when said change is detected by said polarity change detecting means;
wherein said flux parametron circuit is constituted by;
an exciting line including a series connection of a first and a second inductor to which said input exitation signal is applied,
a superconducting loop including a series connection of a third inductor magnetically coupled with said first inductor, a fourth inductor magnetically coupled with said second inductor, and a first and a second Josephson junction,
an input line connected with a first connecting point between said third and fourth inductors to which said difference between said input current and said reference current is applied, and
a load inductor connected between said first connecting point and a second connecting point between said first and second Josephson junctions, said second connecting point being earthed, and said pulse circuit flowing through said load inductor.

13. A superconducting current detecting circuit according to claim 12, further comprising means for receiving magnetic flux to be detected so as to supply said DC flux parametron with a current, as said input current to be detected, which varies in accordance with a value of said magnetic flux to be detected.

* * * * *